US005306981A

United States Patent [19]

Martel et al.

[11] Patent Number: 5,306,981

[45] Date of Patent: Apr. 26, 1994

[54] PIEZOELECTRIC VIBRATOR ASSEMBLY

[75] Inventors: Earl D. Martel, Toronto; Michele C. Blokhuis, Stouffville, both of Canada

[73] Assignee: Humonics International Inc., Canada

[21] Appl. No.: 994,828

[22] Filed: Dec. 22, 1992

Related U.S. Application Data

[63] Continuation-in-part of Ser. No. 979,536, Nov. 19, 1992, abandoned.

[51] Int. Cl.[5] ........................ B05B 17/06; H01L 41/09

[52] U.S. Cl. .................................... 310/348; 310/323; 310/329; 310/345

[58] Field of Search ............... 310/323, 340, 345, 348, 310/329, 338

[56] References Cited

U.S. PATENT DOCUMENTS

| | | | |
|---|---|---|---|
| 3,086,132 | 4/1963 | Ostrow | 310/338 |
| 3,146,360 | 8/1964 | Marshall | 310/338 |
| 3,322,980 | 5/1967 | Faure | 310/338 |
| 3,801,838 | 4/1974 | Kistler | 310/329 |
| 3,890,513 | 6/1975 | Barleen et al. | 310/9.1 |
| 3,901,443 | 8/1975 | Mitsui et al. | 239/102 |
| 3,937,991 | 2/1976 | Massa et al. | 310/9.1 |
| 4,013,992 | 3/1977 | Dewberry et al. | 340/10 |
| 4,190,783 | 2/1980 | Massa | 310/324 |
| 4,190,784 | 2/1980 | Massa | 310/324 |
| 4,230,383 | 10/1980 | Burnstein et al. | 339/17 R |
| 4,251,031 | 2/1981 | Martin et al. | 310/345 |
| 4,282,530 | 8/1981 | Shipp et al. | 340/629 |
| 4,410,139 | 10/1983 | Nishikawa et al. | 239/102 |
| 4,420,706 | 12/1983 | Siebold et al. | 310/324 |
| 4,485,325 | 11/1984 | Yamamoto et al. | 310/348 |
| 4,660,410 | 4/1987 | Asano et al. | 310/329 |
| 4,746,905 | 5/1988 | Harima et al. | 340/384 E |
| 4,796,807 | 1/1989 | Bendig et al. | 310/323 |
| 4,836,684 | 6/1989 | Javorik et al. | 310/323 |
| 4,989,302 | 2/1991 | Abe et al. | 310/345 |
| 5,021,701 | 6/1991 | Takahashi et al. | 310/345 |

FOREIGN PATENT DOCUMENTS

| | | | |
|---|---|---|---|
| 210798 | 11/1984 | Japan | 310/332 |

*Primary Examiner*—Thomas M. Dougherty
*Attorney, Agent, or Firm*—Joseph P. Gastel

[57] ABSTRACT

A vibrator assembly for mounting on the bottom wall of a tank including a three-part insulating support housing including an outer support housing portion in the form of a nut which is located underneath the wall, a cap and intermediate support housing portion which is mounted with the cap above the wall and with the intermediate support housing portion below the wall and which threadably receives the nut, an inner support housing portion which is held by the nut within the intermediate support housing portion, with the inner support housing portion being part of a subassembly which includes a rubber vibrator support and electrodes and a vibrator and a rubber sealing insert all held within the inner support housing portion of the insulating support support housing and sealed therein by the tightening of the nut onto the intermediate support housing portion.

33 Claims, 5 Drawing Sheets

Fig. 1.
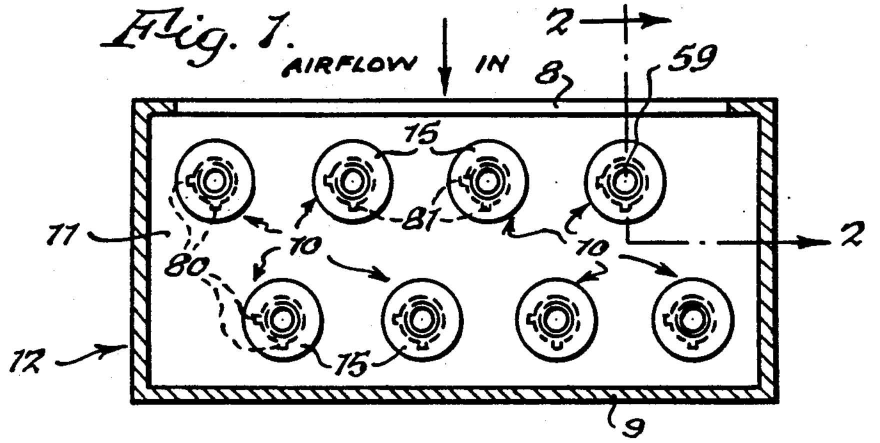
Fig. 2.
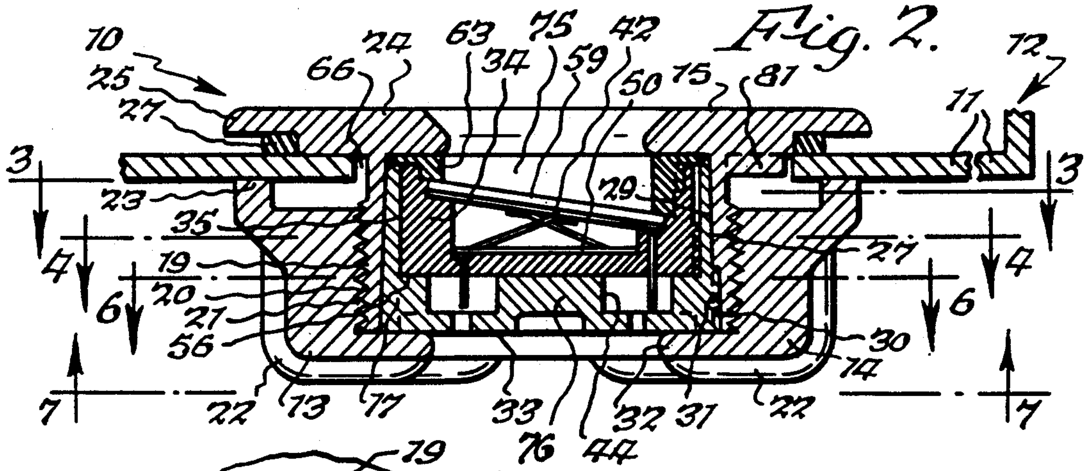
Fig. 3.
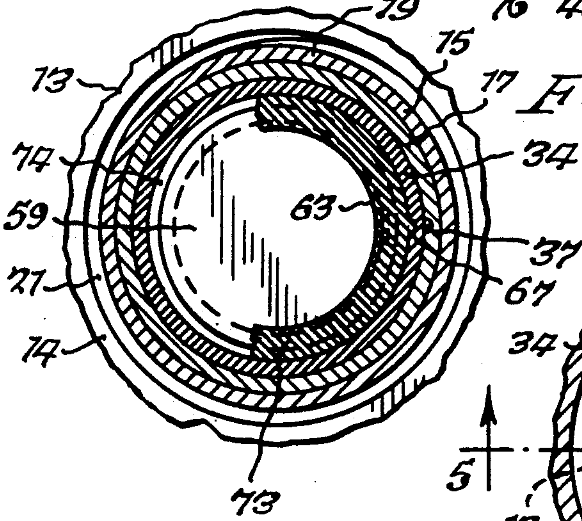
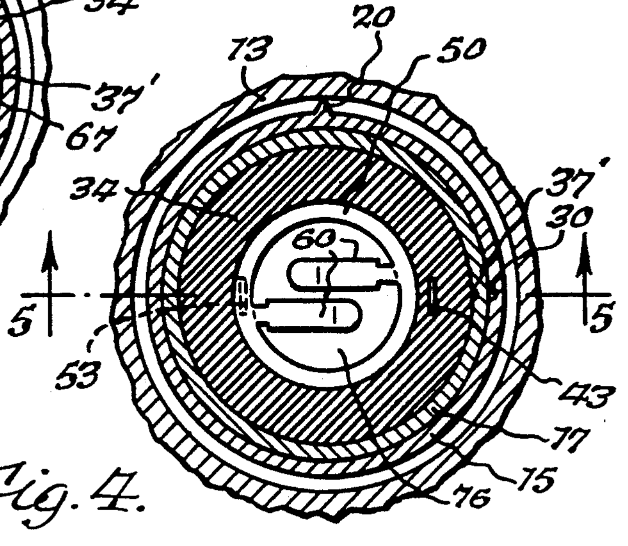
Fig. 4.

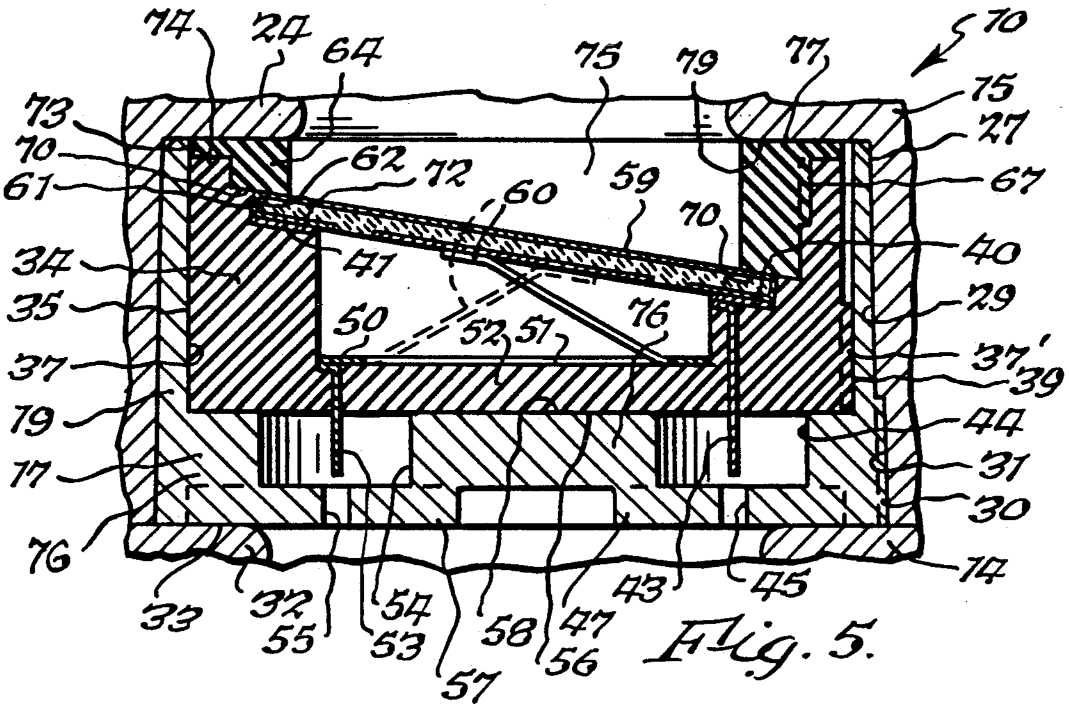
Fig. 5.
Fig. 6.
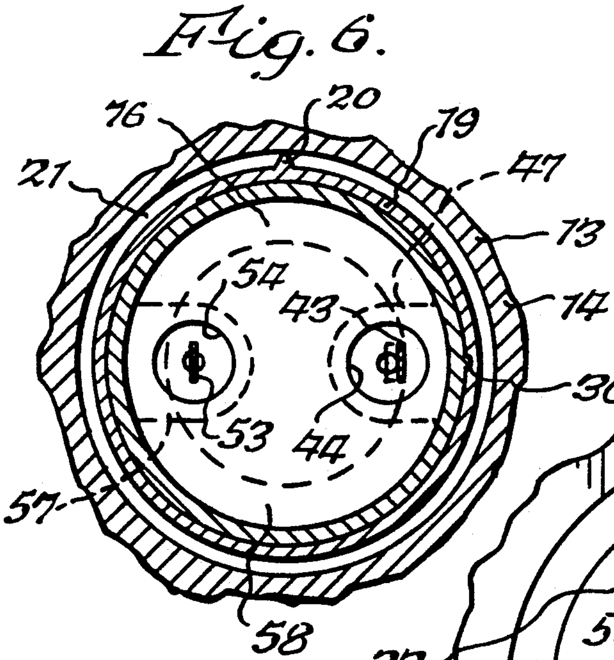
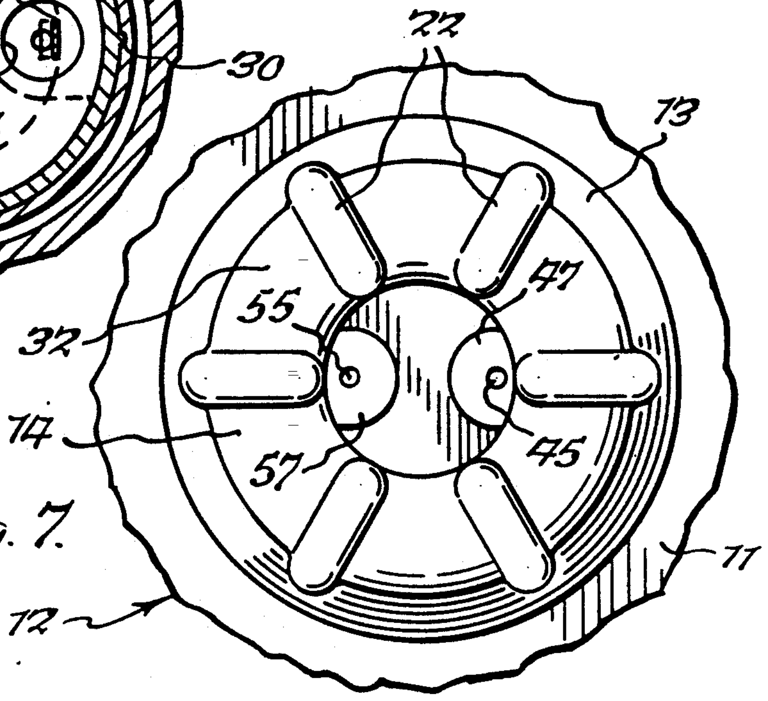
Fig. 7.

PIEZOELECTRIC VIBRATOR ASSEMBLY

CROSS REFERENCE TO RELATED APPLICATION

This application is a continuation-in-part of application Ser. No. 979,536, filed Nov. 19, 1992 now abandoned.

BACKGROUND OF THE INVENTION

The present invention relates to an improved piezoelectric vibrator assembly for atomizing liquid.

There are numerous types of piezoelectric vibrator assemblies in existence. Some have constructions which have relatively small amounts of sealing. Others require tools to assemble them and also install and remove them from their operating environment.

SUMMARY OF THE INVENTION

It is one object of the present invention to provide an improved piezoelectric vibrator assembly which has multiple sealing points between the various parts thereof and the tank in which it is to be installed so as to provide extremely great resistance against leakage of liquid which is being atomized.

Another object of the present invention is to provide an improved piezoelectric vibrator assembly which contains a subassembly of the vibrator and the vibrator support and electrodes therefor and various seals which can be maintained as a shelf item and can replace like subassemblies as necessary by merely substituting this subassembly into a insulating support housing therefor which is mounted on a tank.

A further object of the present invention is to provide an improved piezoelectric vibrator assembly which can be installed in a tank in a fluid-tight manner and removed therefrom without tools. Other objects and attendant advantages of the present invention will readily be perceived hereafter.

The present invention relates to a vibrator assembly for mounting on the wall of a tank comprising a support housing including an inner support housing portion and outer support housing means mounting said inner support housing portion, a separate vibrator support mounted in said inner support housing portion, a vibrator mounted on said vibrator support, insert means mounted in said inner support housing portion for holding said vibrator in position on said vibrator support, retaining means on said outer support housing means extending on opposite sides of said wall for retaining said vibrator assembly in mounted position on said wall, and securing means for maintaining said vibrator support and said vibrator and said insert means in assembled relationship within said inner support housing.

The present invention also relates to a subassembly of a vibrator support assembly comprising a rigid housing, a vibrator support in said rigid housing, an inclined ledge on said vibrator support, a disc-shaped vibrator on said inclined ledge, an insert in said vibrator support, and an end on said insert for engaging said disc-shaped vibrator.

The various aspects of the present invention will be more fully understood when the following portions of the specification are read in conjunction with the accompanying drawings wherein:

BRIEF DESCRIPTION OF THE DRAWINGS

FIG. 1 is a plan view of a tank having a plurality of piezoelectric vibrator assemblies of the present invention mounted in the bottom thereof;

FIG. 2 is a fragmentary cross sectional view taken substantially along line 2—2 of FIG. 1 and showing the various components of the transducer assembly and their relationship to the bottom wall of the tank;

FIG. 3 is a fragmentary cross sectional view taken substantially along line 3—3 of FIG. 2;

FIG. 4 is a fragmentary cross sectional view taken substantially along line 4—4 of FIG. 2;

FIG. 5 is an enlarged fragmentary cross sectional view taken substantially along line 5—5 of FIG. 4 and essentially showing portions of FIG. 2 in an enlarged form for greater clarity;

FIG. 6 is a fragmentary cross sectional view taken substantially along line 6—6 of FIG. 2;

FIG. 7 is a fragmentary view of the bottom of the insulating support taken substantially in the direction of arrows 7—7 of FIG. 2;

DESCRIPTION OF THE PREFERRED EMBODIMENTS

Figure 8:
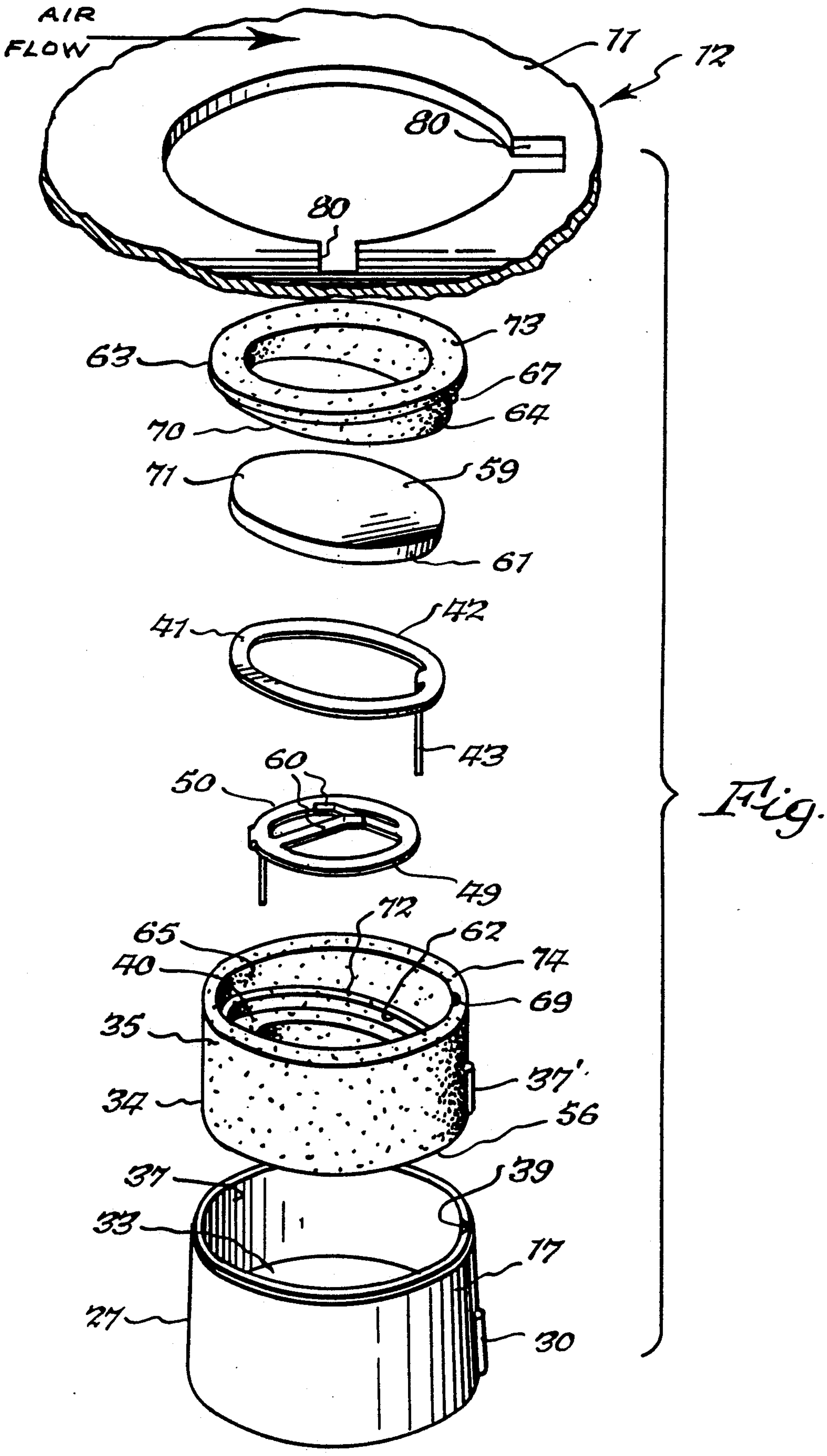
FIG. 8 is an exploded view of various parts of the transducer assembly.

Summarizing briefly in advance, a plurality of piezoelectric vibrator assemblies 10 are mounted in the bottom wall 11 of a tank 12 containing water or any other type of liquid which is to be atomized. Each vibrator assembly 10 consists of an uniquely integrated series of parts which permits certain parts to be maintained as a subassembly to serve as a replaceable shelf item which can be replaced in the remainder of the assembly without tools, as required for repair and which will provide multiple seals between parts of the assembly 10 itself and between the assembly and the bottom wall 11 to prevent leakage of liquid from tank 12.

In FIG. 1 a plurality of vibrator assemblies 10 are mounted in the bottom wall 11 of a tank 12. Wall 8 of the tank has openings which permit the passage of air which is to be humidified. Air enters through wall 8 and leaves through a series of diffusers (not shown) mounted on the ceiling (not shown) of the tank which is supported on wall 9 and the other walls of the tank. In passing through the tank, the air passes over water located above the plurality of vibrator assemblies 10, and the air is thus humidified with the atomized water produced by the vibrator assemblies 10, which are staggered so as to maximize the humidification.

As noted above, each vibrator assembly is secured to bottom wall 11 of tank 12. To this end, each vibrator assembly 10 includes an insulating support housing 13 consisting of a nut or outer support housing portion 14, a cap and intermediate support housing portion 15, and an inner support housing portion 17. The three parts 14, 15 and 17 of the insulating support housing 13 are assembled with each other and mounted on bottom wall 11 in the following manner. The cap and intermediate insulating support housing 15 includes a cylindrical lower portion 19 having threads 20 thereon which are threadably received in threads 21 of nut 14 which has protruding ribs or ridges 22 thereon which can be digitally grasped to turn nut 14 onto lower portion 19 of intermediate support housing portion 15. When nut 14 is tightened, its annular end 23 will bear on the underside of bottom wall 11 to draw upper horizontal portion 24 of cap 15 downwardly so that the outer annular flange 25 thereof will bear on 0-ring or seal 27 to provide a water-tight joint between flange 25 and the upper surface of bottom wall 11 of tank 12. Inner portion 17 of insulating support housing 13 includes a tapered outer surface 27 which is engaged by tapered inner surface 29 of lower portion 19 of intermediate support housing portion 15. A key 30 on the outer surface of inner support housing portion 17 is received in a keyway 31 in lower intermediate support housing portion 19 to thereby orient inner support housing portion 17 in a predetermined position therein. The lower annular flange 32 of outer insulating support housing 14 bears on the outer peripheral portion of bottom wall 33 of inner support housing portion 17 to firmly secure the three insulating support housings 14, 15 and 17 together. Insulating support housing portions 14, 15 and 17 are preferably fabricated of a suitable rigid molded plastic material, such as polystyrene or any other suitable plastic material.

A vibrator support 34 is supported within inner portion 17 of insulating support housing 14. Vibrator support 34 includes a cylindrical outer surface 35 which is received with a close fit within internal cylindrical surface 37 of inner support housing portion 17. A key 37', which is molded outwardly on surface 35, is received in keyway 39 of inner support housing portion 17 to thereby orient it relative thereto and relative to intermediate support housing portion 15, considering that inner support housing portion 17 is oriented relative to intermediate support housing portion 15 by the keyway connection 30, 31. Vibrator support or holder 34 is fabricated of deformable rubber, and it includes an inclined ledge 40 (FIGS. 5 and 8) on which the circular portion 41 of electrode 42 rests. A stem 43 extends downwardly from electrode portion 42 into cylindrical chamber 44 of inner support housing portion 17. An electrical lead, not shown, is soldered to electrode stem 43 and extends outwardly through hole 45 in boss 47. A second electrode 49 has a circular base 50 which seats on surface 51 of bottom wall 52 of vibrator support 34. Bottom wall 52 of the vibrator support 34 seats on bottom wall 76 of inner housing portion 17. A stem 53 extends downwardly through wall 52 into cylindrical chamber 54. An electrical lead, not shown, is soldered to stem 53 and extends through hole 55 in boss 57.

A disc-shaped piezoelectric vibrator 59 is in contact with circular electrode portion 42 and rests thereon in an inclined attitude. The inclination causes the drops of water which are projected perpendicularly from the surface of the vibrator 59 not to fall back on each other. Fingers 60 of electrode 49 extend upwardly from circular electrode portion 50 and contact the central portion of vibrator 59. The outer peripheral portion 61 of vibrator 59 is confined by wall 62 (FIG. 8) of vibrator support 34.

In order to secure vibrator 59 within vibrator support or holder 34, an insert 63 is provided. Insert 63, which is fabricated of deformable rubber, includes a lower body portion 64 which is received within portion 65 (FIG. 8) of vibrator support 34. A molded key 67 on insert 63 is received in keyway 69 of vibrator support 34 to thereby properly align it relative thereto. The lower end surface 70 of insert 63 therefore bears on the outer peripheral edge 71 of vibrator 59 and it also bears on ledge or shoulder 72 (FIG. 8) of vibrator support 34. A flange 73 on insert 63 bears against the upper end 74 of vibrator support 34.

As noted above, after outer support housing portion 14 is fully threaded onto intermediate support housing portion 15, a good seal is provided by O-ring 27 between flange 25 and the upper surface of bottom wall 11. Also after tightening, surface 58 of inner support housing portion 17 bears on surface 56 of vibrator support 34. The vibrator support 34, the vibrator 59 and the insert 63 and the inner support housing portion 17 are so dimensioned relative to each other so that when the outer support housing portion 14 is fully tightened, there will be a number of areas which provide good seals against leakage of liquid which is present in chamber 75 of the vibrator assembly. Thus, the vibrator support 34 and insert 63 constitute a combined vibrator support and sealing arrangement. The sealing against leakage is obtained because the deformable rubber vibrator support 34 and the deformable insert 63, which are confined between surface 58 of inner support housing portion and surface 79 of cap 15, are deformed during the tightening of the nut 14 onto cap 15. In this respect, the combined height of vibrator support 34 and insert 63 is greater than the distance between surface 58 of inner support housing portion 17 and surface 79 of cap 15 so that when outer support housing portion 14 is fully tightened on intermediate support housing portion, vibrator support 34 and insert 63 are slightly compressed axially and tend to also bow outwardly radially. Thus, a good seal will be provided between the upper end portion 77 of insert 63 and annular surface 79 of cap 15. Also a good seal will be provided between surface 70 of insert 64 and the outer peripheral portion 71 of vibrator 59. Furthermore, a good seal will be provided between annular end 74 of vibrator support 34 and flange 73 of insert 64. Also, a good seal will be provided between the annular edge surface 61 of vibrator 59 and the surface 62 of vibrator support 34. Also, a good seal will be provided between the undersurface 70 of insert 64 and ledge 72 of vibrator support 34. A good seal is also provided between surface 58 of inner support housing portion 17 and surface 56 of vibrator support 34. Thus, because of the interfitting and dimensioning of the various parts, namely, the outer support housing portion 15, the inner support housing portion 17, the vibrator support 34, the vibrator 59, and insert 63, good sealing against leakage of liquid from chamber 75 is obtained. In addition, because vibrator support 34 is fabricated of deformable rubber and inner insulating support housing 17 is fabricated of rigid plastic, when the cap and intermediate housing portion is tightened by the nut 14, the compressive force exerted on vibrator support 34 will cause its outer surface 35 to press against inner surface 37 of inner support housing portion 17 to thereby also provide a liquid-tight seal therebetween.

Each opening 66 in the bottom wall 11 of tank 12 (FIG. 8) has two keyways 80 therein. Each intermediate support housing portion 15 also has two keys 81 therein. Keys 81 fit into keyways 80 to thereby always orient cap 15 in a predetermined orientation relative to bottom wall 11. Therefore, vibrator discs 59 of all of the assemblies 10 will always be oriented in the same direction considering the keyed relationship 80–81 and that inner support housing portion 17 is keyed to intermediate support housing portion 15 and vibrator support 34 is keyed to inner support housing portion 17. As can be perceived from FIGS. 1, 2 and 8, when the assemblies 10 are mounted on wall 11 of the tank, the airflow will initially pass over the high ends of vibrator 59.

As noted above, the inner support housing portion 17 and the vibrator support 34 and the vibrator 59 and the insert 63 constitute a subassembly which is a replacement item. Therefore, in the event that it is required to replace this subassembly, it is merely necessary to unscrew outer support housing portion 14 from cap and intermediate support housing portion 15, withdraw the above-mentioned subassembly, insert a new subassembly of these parts, and tighten the nut 14 onto intermediate support housing portion 15.

Figure 9:
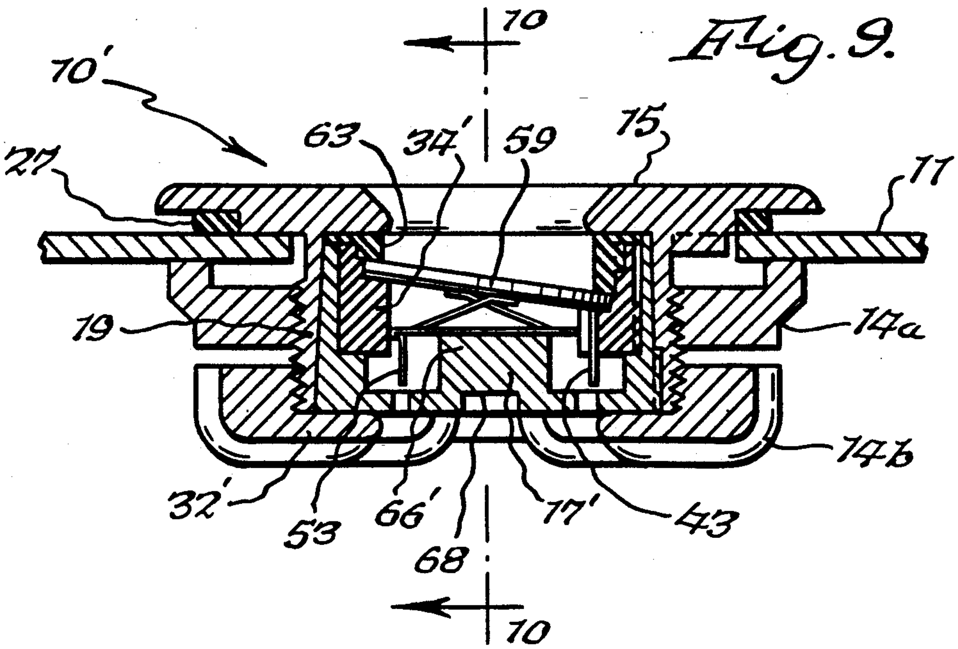
FIG. 9 is a fragmentary cross sectional view similar to FIG. 2 but showing a preferred embodiment of the present invention.
Figure 10:
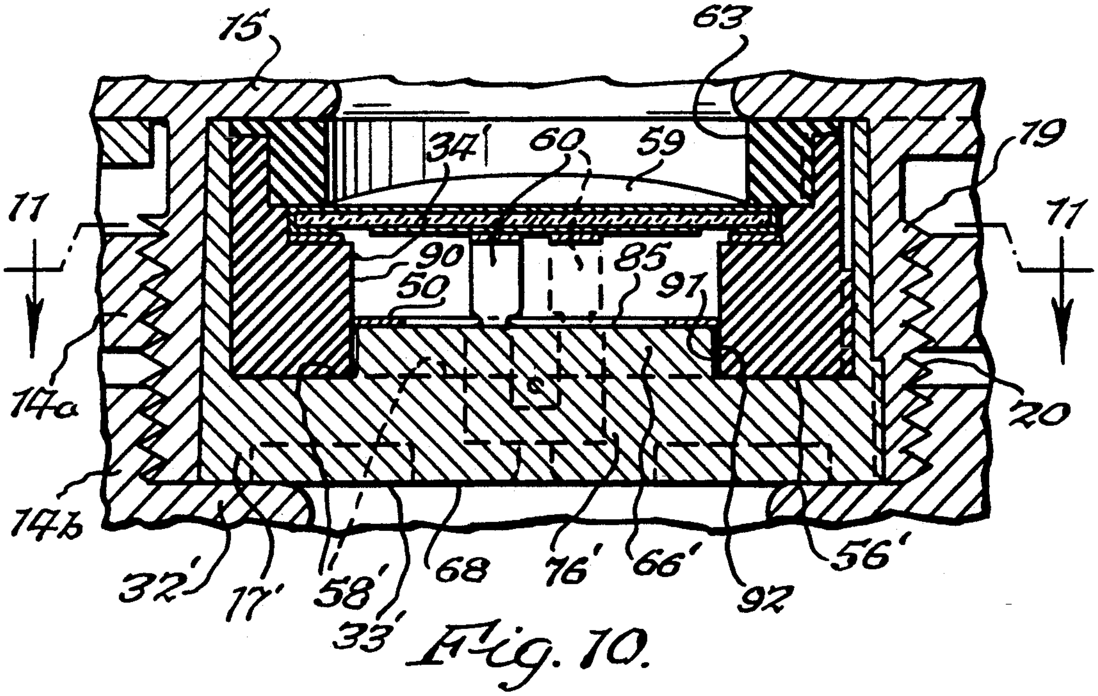
FIG. 10 is an enlarged fragmentary cross sectional view taken substantially along line 10—10 of FIG. 9.
Figure 11:
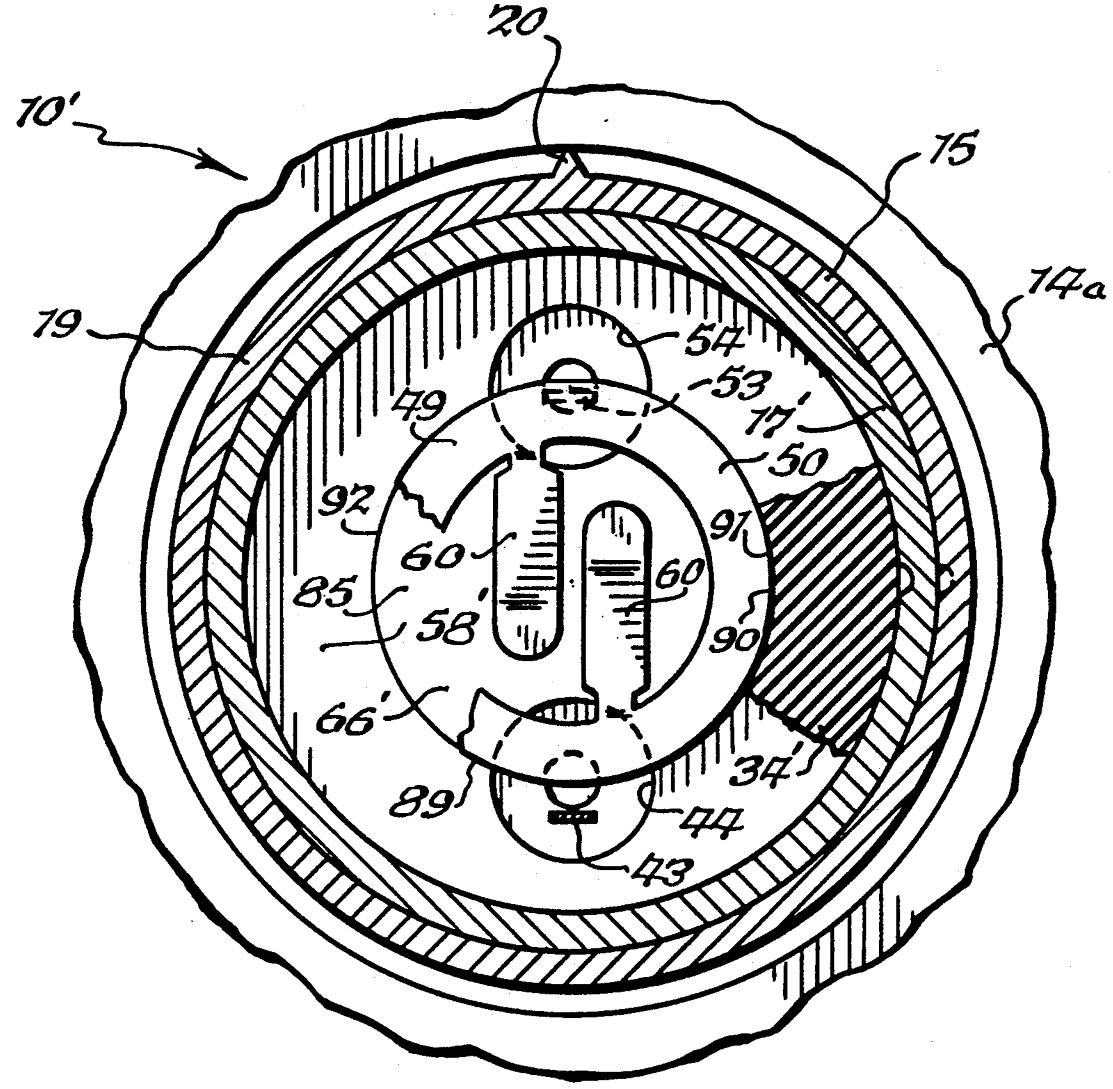
FIG. 11 is a greatly enlarged fragmentary cross sectional view taken substantially along line 11—11 of FIG. 10.

In FIGS. 9–11 a preferred embodiment 10′ of the present invention is disclosed. Summarizing in advance, the major differences between the embodiment of FIGS. 9–11 and the embodiment of FIGS. 1–8 are as follows: (1) The outer support housing portion in the form of a nut 14 of FIGS. 1–8 has been split into two parts and now consists of nuts 14*a* and 14*b* in the embodiment of FIGS. 9–11. (2) The vibrator support 34 of FIGS. 1–8 has been modified so that it is now an annular member 34′ in the embodiment of FIGS. 9–11 without the bottom wall 52 of the embodiment of FIGS. 1–8. In addition, the bottom wall 76′ of inner housing portion 17′ now has a boss 66′ thereon to mount the circular electrode portion 50 of electrode 49 on its upper surface 85.

At this point it is to be noted that all parts shown FIGS. 9–11 which have numerals which are identical to the numerals utilized in FIGS. 1–8 represent identical elements of structure, and, in the interest of brevity, a detailed description of such elements will be omitted. Furthermore, elements of structure denoted by primed numerals in FIGS. 9–11 in most instances correspond to modified elements of structure of FIGS. 1–8 having identical numerals which are unprimed.

The reason that the support housing portion 14 in the form of a nut of FIGS. 1–8 has been split into two nuts 14*a* and 14*b* in the embodment of FIGS. 9–11 is to permit the replacement of the subassembly of the inner support housing portion 17′ and the vibrator support 34′ and the vibrator 59 and the insert 63 and the electrodes 49 and 41 into cylindrical lower portion 19 of the housing portion 15 without the necessity of displacing housing portion 15 from its mounted relationship on wall 11. More specifically, during the initial installation on wall 11, the upper nut portion 14*a* is threaded onto threads 20 to tighten intermediate support housing portion 15 onto bottom wall 11 of the tank. Once this has been done, the member 15 need not be unthreaded from upper nut member 14*a* unless it is desired to replace it. The subassembly of parts 17′, 34′, 59, 41, 49 and 63 can then be inserted into lower portion 19 of intermediate support housing portion 15 as described above relative to the embodiment of FIGS. 1–8. Thereafter, the lower nut portion 14*b* is tightened onto threads 20 so that the lower annular flange 32′ bears on the outer peripheral portion of bottom wall 33′. Thus, the subassembly described above can be removed and replaced by the use of lower nut portion 14*b*.

As can be seen from FIGS. 10 and 11, the circular base 50 of electrode 49 is of the same diameter as boss 66′ on which it is mounted. Furthermore, it is confined against lateral movement because its outer edge 89 bears against inner surface 90 of vibrator support 34′. The boss 66′ thus provides a stable rigid surface for electrode 49. The lowermost annular edge 56′ of vibrator support 34′ is supported by annular surface 58′ of wall 76′ of inner housing portion 17′, and the lower cylindrical side portion 91 of surface 90 encircles side 92 of boss 66′, and thus the lower portion of vibrator support 34′ is stabilized against lateral inward movement.

It can thus be seen that the improved piezoelectric vibrator assemblies 10 and 10′ of the present invention can be installed in an extremely simple and expedient manner, and, once installed, will provide good liquid-tight connections between the tank in which they are located and between the various parts of the assembly itself, and, further, since the above-described subassemblies are shelf items, they can be easily installed and disassembled from the remainder of their respective assemblies in a simple and expedient manner without tools.

While a preferred embodiment of the present invention has been disclosed, it will be appreciated that it is not limited thereto but may be otherwise embodied within the scope of the following claims.

What is claimed is:

1. A vibrator assembly for mounting on the wall of a tank and for atomizing liquid in said tank comprising a support housing including an inner support housing portion and a separate outer support housing means mounting said inner support housing portion, a separate vibrator support mounted in said inner support housing portion, vibrator means for projecting liquid mounted on said vibrator support, an outer peripheral edge on said vibrator means, insert means mounted in said inner support housing portion for bearing on said outer peripheral edge and holding said vibrator means in position on said vibrator support, a chamber for liquid located within said support housing immediately above said vibrator means, retaining means on said outer support housing means for retaining said vibrator assembly in mounted position on said wall, and securing means for maintaining said vibrator support and said vibrator means and said insert means is assembled relationship within said inner support housing.

2. A vibrator assembly as set forth in claim 1 wherein said inner support housing portion is fabricated of rigid material, and wherein said vibrator support and said insert means are fabricated of rubber.

3. A vibrator assembly as set forth in claim 2 wherein said vibrator support and said insert means are in sealing engagement with said inner support housing portion.

4. A vibrator assembly as set forth in claim 3 wherein said insert means are also in sealing engagement with said outer support housing means.

5. A vibrator assembly as set forth in claim 4 wherein said retaining means comprises an intermediate cap on said outer support housing means and a portion of said outer support housing means and a nut, thread means between said nut and said intermediate portion of said outer support housing means for effecting a threaded relationship therebetween, and an end on said nut located below said wall for bearing on the underside of said wall and drawing said cap toward said wall as said nut is tightened onto said portion of said outer support housing means.

6. A vibrator assembly as set forth in claim 5 including seal means between said cap and said wall for providing a seal between said cap and said wall.

7. A vibrator assembly as set forth in claim 5 including a first surface on said inner support housing portion, a second surface on said cap spaced from said first surface and located in opposition thereto, said vibrator support and said insert means and said vibrator means being so dimensioned so that their combined height when said vibrator support and said insert means are relaxed is greater than the space between first and second surfaces when said nut is tightly screwed onto said intermediate portion whereby said vibrator support and said insert means are slightly deformed to provide sealing between said cap and said insert means and between said insert means and said vibrator support and between said vibrator support and said vibrator means and said insert means.

8. A vibrator assembly as set forth in claim 1 wherein said outer support housing means includes an upper portion including a cap for positioning above said wall and a lower portion for positioning below said wall, and wherein said retaining means comprises a first nut for mounting on said lower portion below said wall for drawing said cap toward said wall to clamp said wall therebetween, and wherein said securing means comprises a second nut for mounting on said lower portion of said outer support housing means.

9. A vibrator assembly as set forth in claim 8 including seal means between said cap and said wall for effecting a seal therebetween.

10. A vibrator assembly as set forth in claim 1 wherein said retaining means and said securing means comprise a single nut.

11. A vibrator assembly for mounting on the wall of a tank comprising an outer support housing portion for positioning below said wall, a combined cap and intermediate support housing portion, cap means on said cap for positioning above said wall, first thread means on said intermediate support housing portion for positioning below said wall, an inner support housing portion for positioning in said intermediate support housing portion, second thread means on said outer support housing portion for engaging said first thread means on said intermediate support housing portion, means on said outer support housing portion for bearing on the underside of said wall when said first and second thread means are tightened, first seal means between said cap means and said wall for effecting sealing therebetween when said first and second thread means are tightened, vibrator means for projecting liquid, a vibrator support for supporting said vibrator means in said inner support housing portion, and second seal means in said inner support housing portion for effecting a liquid tight seal between said vibrator support and said cap.

12. A vibrator assembly as set forth in claim 11 wherein said second seal means also effects a seal between said inner support housing and said vibrator support.

13. A vibrator assembly as set forth in claim 12 wherein said vibrator support includes a first ledge therein for supporting said vibrator means, and wherein said second seal means comprises an insert, and a second ledge on said vibrator support for receiving said insert in abutting relationship with a portion of said insert overlying said vibrator means.

14. A vibrator assembly for mounting on the wall of a tank comprising an outer support housing portion for positioning below said wall, a combined cap and intermediate support housing, cap means on said cap for positioning above said wall, housing means on said intermediate support housing for positioning below said wall, an inner support housing for positioning in said intermediate support housing, a vibrator support in said inner support housing, first key means between said inner support housing and said intermediate support housing for effecting a first predetermined alignment therebetween, second key means between said inner support housing and said vibrator support for effecting a second predetermined alignment therebetween, insert means in said inner housing for effecting a seal between said inner support housing and said cap, third key means between said vibrator support and said insert means for effecting a third predetermined alignment therebetween, an inclined ledge on said vibrator support, disc-shaped vibrator means for projecting liquid positioned in an inclined attitude on said inclined ledge, and an inclined edge on said insert for effecting a seal with said vibrator means.

15. A vibrator assembly as set forth in claim 14 including a second inclined edge on said vibrator support, and said inclined edge on said insert for also effecting a seal with said second inclined edge.

16. A vibrator assembly as set forth in claim 14 including fourth key means on said combined cap and intermediate support housing for effecting a fourth predetermined alignment between said combined cap and intermediate support housing and said wall, whereby said first, second, third and fourth key means cause said vibrator means to assume a predetermined orientation in its inclined attitude relative to said fourth key means and to said wall.

17. A vibrator assembly as set forth in claim 14 wherein said insert means is fabricated of rubber.

18. A vibrator assembly as set forth in claim 17 wherein said vibrator support is fabricated of rubber.

19. A vibrator assembly as set forth in claim 14 including seal means between said cap means and said wall for effecting a seal therebetween.

20. A vibrator assembly as set forth in claim 19 including thread means between said outer support housing portion and said housing means on said intermediate support housing, and means on said outer support housing portion for bearing on the underside of said wall as a result of tightening of said thread means to thereby cause said seal means to provide said seal between said cap means and said wall.

21. A vibrator assembly as set forth in claim 20 wherein said cap includes a portion which bears on said insert to effect a seal therebetween when said thread means are tightened.

22. A vibrator assembly as set forth in claim 21 wherein said insert means is fabricated of rubber.

23. A vibrator assembly as set forth in claim 22 wherein said vibrator support is fabricated of rubber.

24. A subassembly of a vibrator support assembly for atomizing liquid comprising a rigid housing, a separate vibrator support in said rigid housing, an inclined ledge on said vibrator support, disc-shaped vibrator means for projecting liquid, first and second sides on said vibrator means, an outer peripheral edge on said vibrator means, said first side of said vibrator means at said outer peripheral edge being supported on said inclined ledge, an insert in said vibrator support, an end on said insert for engaging said outer peripheral edge on said second side of said disc-shaped vibrator means in opposition to said inclined ledge, and a chamber for liquid located immediately above said vibrator means.

25. A subassembly of a vibrator support assembly as set forth in claim 24 including a second inclined ledge on said vibrator support, and wherein said end on said insert also engages said second inclined ledge.

26. A subassembly of a vibrator support assembly as set forth in claim 24 including first key means between said rigid housing and said vibrator support to effect a first predetermined orientation therebetween, and second key means between said insert and said vibrator support to effect a second predetermined orientation therebetween.

27. A subassembly of a vibrator support assembly as set forth in claim 24 wherein said insert is fabricated of rubber.

28. A subassembly of a vibrator support assembly as set forth in claim 27 wherein said vibrator support is fabricated of rubber.

29. A vibrator assembly as set forth in claim 24 including a bottom wall on said rigid housing, an upstanding boss on said bottom wall, and said vibrator support including an annular portion in encircling relationship with said boss.

30. A vibrator assembly for atomizing liquid comprising a first support housing, vibrator means for atomizing liquid, means for mounting said vibrator means in said first support housing, a second support housing, first mounting means on said second support housing for mounting said second support housing on a tank for liquid, and second mounting means for removably mounting said first support housing in said second support housing, said second mounting means including means for permitting removal and reinsertion of said first support housing and said vibrator means and said means mounting said vibrator means in said first support housing relative to said second support housing while said first mounting means retains said second support housing in its mounted position on said tank.

31. A vibrator assembly for mounting on the wall of a tank and for atomizing liquid in said tank comprising a support housing including an inner support housing portion and separate outer support housing means mounting said inner support housing portion, a bottom wall on said inner support housing portion, an upstanding boss on said bottom wall, a separate annular vibrator support having a lower portion mounted on said bottom wall of said inner support housing portion in encircling relationship to said upstanding boss, an inclined ledge on said vibrator support, vibrator means for projecting liquid having an outer peripheral edge mounted on said inclined ledge of said vibrator support, insert means mounted in said inner support housing portion for engaging said outer peripheral edge of said vibrator means is opposition to said inclined ledge for holding said vibrator means in position on said vibrator support, a chamber for liquid located within said support housing immediately above said vibrator means, retaining means on said outer support housing means for retaining said vibrator assembly in mounted position on said wall, and securing means for maintaining said vibrator support and said vibrator means and said insert means in assembled relationship within said inner support housing.

32. A vibrator assembly as set forth in claim 30 wherein said vibrator means includes a central portion, a first electrode located between said ledge and said outer peripheral edge of said vibrator means for engaging said outer peripheral edge, and a second electrode mounted on said boss and including portions for engaging said central portion of said vibrator means.

33. A vibrator assembly as set forth in claim 32 including openings in said bottom wall for receiving portions of said first and second electrodes.

* * * * *

UNITED STATES PATENT AND TRADEMARK OFFICE
CERTIFICATE OF CORRECTION

PATENT NO. : 5,306,981

DATED : April 26, 1994

INVENTOR(S) : Earl D. Martel et al

It is certified that error appears in the above-identified patent and that said Letters Patent is hereby corrected as shown below:

Column 5, line 34, after "shown" insert --in--.

Column 10, line 27 (claim 32), change "30" to --31--.

Signed and Sealed this

Second Day of August, 1994

Attest:

BRUCE LEHMAN

*Attesting Officer*

*Commissioner of Patents and Trademarks*